(12) United States Patent
Okada

(10) Patent No.: US 10,056,495 B2
(45) Date of Patent: Aug. 21, 2018

(54) THIN FILM TRANSISTOR AND DISPLAY DEVICE USING THE SAME

(71) Applicant: Japan Display Inc., Tokyo (JP)

(72) Inventor: Takashi Okada, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/826,820

(22) Filed: Nov. 30, 2017

(65) Prior Publication Data

US 2018/0158959 A1   Jun. 7, 2018

(30) Foreign Application Priority Data

Dec. 7, 2016   (JP) .................. 2016-237575

(51) Int. Cl.
*H01L 29/786*   (2006.01)
*H01L 21/266*   (2006.01)
(Continued)

(52) U.S. Cl.
CPC ..... *H01L 29/78621* (2013.01); *G09G 3/3233* (2013.01); *G09G 3/3648* (2013.01); *H01L 21/266* (2013.01); *H01L 27/127* (2013.01); *H01L 27/1222* (2013.01); *H01L 27/1288* (2013.01); *H01L 29/66757* (2013.01); *H01L 29/78675* (2013.01); *H01L 29/78696* (2013.01); *G02F 1/1368* (2013.01); *G02F 1/13439* (2013.01); *G02F 1/133512* (2013.01); *G02F 1/133514* (2013.01); *G02F 1/136286* (2013.01); *G02F 2001/13685* (2013.01); *G02F 2001/133519* (2013.01); *G02F 2202/104* (2013.01); *G09G 2300/0426* (2013.01); *G09G 2300/0842* (2013.01);

(Continued)

(58) Field of Classification Search
CPC ......... H01L 29/78621; H01L 29/66757; H01L 29/78675; H01L 29/78696; H01L 21/266; H01L 27/1222; H01L 27/127; H01L 27/1288; G09G 3/3233; G09G 3/3648
USPC .......................................................... 257/72
See application file for complete search history.

(56) References Cited

U.S. PATENT DOCUMENTS 5,998,848 A   12/1999   Brown et al.
7,598,526 B2 *   10/2009   Godo ................ H01L 29/66757
                                                                257/72
2001/0010381 A1   8/2001   Jung et al.

FOREIGN PATENT DOCUMENTS

JP   2000-101084 A   4/2000
JP   2001-217412 A   8/2001

* cited by examiner

*Primary Examiner* — Stephen Bradley
*Assistant Examiner* — Patricia Reddington
(74) *Attorney, Agent, or Firm* — Typha IP LLC

(57) ABSTRACT

The purpose of the invention is to eliminate an abnormal current at an edge of a semiconductor layer in a thin film transistor. The invention is: A thin film transistor having a semiconductor layer comprising: a channel, a drain and a source are formed in the semiconductor layer, the channel has a channel length and a channel width, a LDD (Light Doped Drain) is formed between the channel and the drain or between the channel and the source, the LDD including a first LDD area, which is formed at a center of the LDD in the direction of the channel width, and a second LDD area, which is formed at an edge of the LDD in the direction of the channel width, wherein a width of the second LDD area in the channel length direction is bigger than a width of the first LDD area in the channel length direction.

13 Claims, 14 Drawing Sheets

(51) Int. Cl.
  *H01L 27/12*     (2006.01)
  *H01L 29/66*     (2006.01)
  *G09G 3/3233*    (2016.01)
  *G09G 3/36*      (2006.01)
  *H01L 27/32*         (2006.01)
  *G02F 1/1368*        (2006.01)
  *H01L 21/265*        (2006.01)
  *G02F 1/1362*        (2006.01)
  *G02F 1/1343*        (2006.01)
  *G02F 1/1335*        (2006.01)

(52) U.S. Cl.
  CPC .............. *G09G 2300/0871* (2013.01); *G09G 2320/0233* (2013.01); *H01L 21/26513* (2013.01); *H01L 27/124* (2013.01); *H01L 27/1255* (2013.01); *H01L 27/3262* (2013.01); *H01L 27/3276* (2013.01); *H01L 2227/323* (2013.01)

THIN FILM TRANSISTOR AND DISPLAY DEVICE USING THE SAME

CLAIM OF PRIORITY

The present application claims priority from Japanese Patent Application JP 2016-237575 filed on Dec. 7, 2016, the content of which is hereby incorporated by reference into this application.

BACKGROUND OF THE INVENTION (1) Field of the Invention

The present invention relates to display devices like a liquid crystal display device or an organic EL display device that use thin film transistors.

(2) Description of the Related Art

A liquid crystal display device has a Thin Film Transistor (herein after TFT) in each of the pixels to control taking data in the pixel. Sometimes a driving circuit is formed by TFTs.

An organic EL display device has a first TFT as a switching element to control taking data in the pixel, and a second TFT that controls a current to the light emitting element. Sometimes a driving circuit is formed by TFTs.

Therefore, current-voltage characteristics of the TFTs have a significant influence to characteristics of the liquid crystal display device and the organic EL display device. In TFT, a current in the drain or in the source is controlled by a voltage Vgs between the gate electrode and the source electrode. By the way, the drain and the source interchange periodically in the TFT, thus, the terms of the source and the drain may be interchangeably used in this specification except specifically noted.

The TFT controls the source-drain current Ids by controlling a current at the channel that is formed under the gate electrode; however, an electric field at the edge of the channel in a plan view tends to be irregular, consequently, the current that flow edge of the channel makes the Ids characteristics irregular.

Patent document 1 (Japanese patent laid open 2000-101084) discloses to suppress a current at the edge of the channel of the TFT by making a resistance at the edge of the channel large, thus, to prevent the Ids characteristics from being irregular.

SUMMARY OF THE INVENTION

The structure of the patent document 1 is to suppress a current at the edge of the channel of the TFT by making a resistance at the edge of the channel large, thus, to prevent the Ids characteristics from being irregular; this structure, however, needs to process the channel, consequently, this process has a possibility to make the characteristics of the TFT unstable. In addition, this structure makes a width of the channel narrow, consequently, ON current of the TFT is suppressed.

The purpose of the present invention is to avoid an irregularity in Ids characteristics of the TFT without inducing instability in characteristics of the TFT; thus, to maintain a linearity of brightness characteristics and linearity of color to achieve a high quality images in the display device, The present invention solves the above problem; the concrete measures are as follows:

(1) A thin film transistor having a semiconductor layer, a gate insulating film and a gate electrode comprising: a channel, a drain and a source are formed in the semiconductor layer, the channel has a channel length and a channel width, a LDD (Light Doped Drain) is formed between the channel and the drain or between the channel and the source, the LDD including a first LDD area, which is formed at a center of the LDD in the direction of the channel width, and a second LDD area, which is formed at an edge of the LDD in the direction of the channel width, wherein a width of the second LDD area in the channel length direction is bigger than a width of the first LDD area in the channel length direction.

(2) The thin film transistor according to (1), wherein the width of the second LDD area in the channel length direction is two times or more of the width of the first LDD area in the channel length direction.

DETAILED DESCRIPTION OF THE PREFERRED EMBODIMENTS

Figure 1:
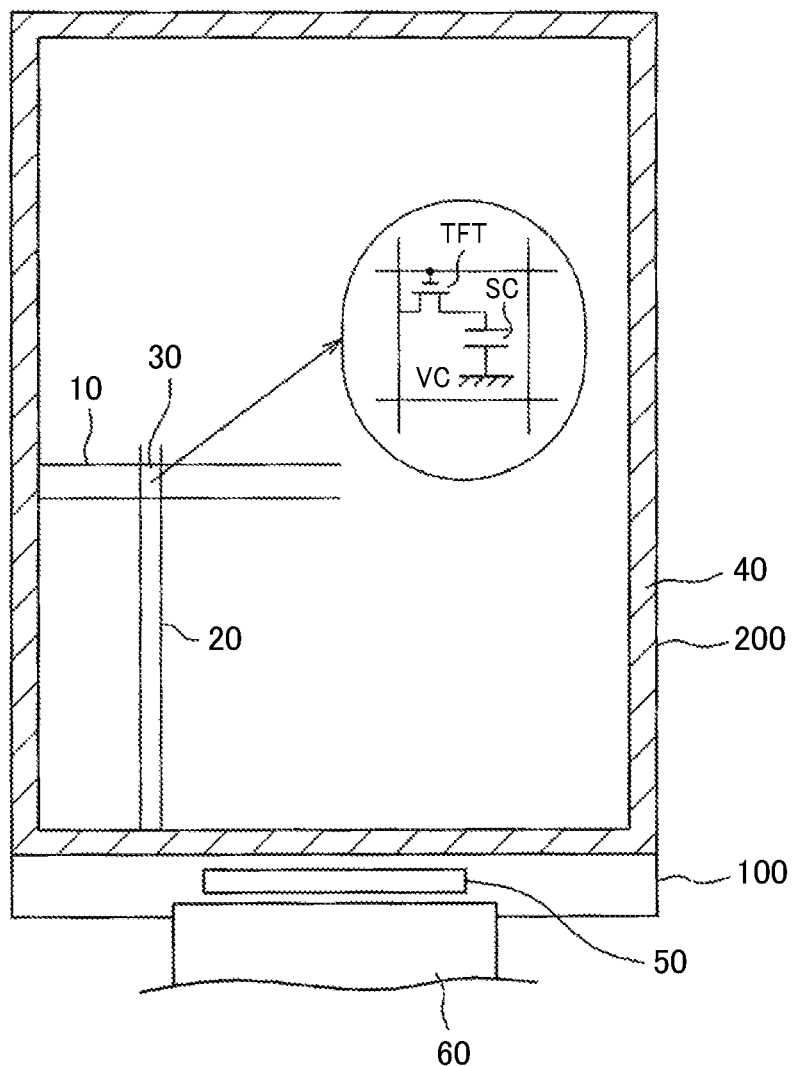
FIG. 1 is a plan view of the liquid crystal display device that the present invention is applied.

At the outset, the present invention is explained when it is applied to the liquid crystal display device. FIG. 1 is a plan view of a liquid crystal display device, which is used in e.g. a cellar phone. In FIG. 1, the TFT substrate 100, where the scanning lines 10 and the video signal lines 20 are formed, and the counter substrate 200, where the black matrix is formed, adhere to each other via the seal material 40. The liquid crystal layer is sandwiched between the TFT substrate 100 and the counter substrate 200.

The TFT substrate 100 is formed larger than the counter substrate 200; the portion where the TFT substrate and the counter substrate doesn't overlap is the terminal area. The driver IC 50 that drives the liquid crystal display device is installed in the terminal area. The flexible wiring substrate 60 is connected to the terminal area to supply powers and signals to the liquid crystal display device.

In FIG. 1, the scanning lines 10 extend in lateral direction and arranged in longitudinal direction; the video signal lines 20 extend in longitudinal direction and arranged in lateral direction. The pixel 30 is formed in an area surrounded by the scanning lines 10 and the video signal lines 20. In the pixel, the TFT to control importing video signal data and the storage capacitance SC to hold the imported data for one frame period are formed. One terminal of the storage capacitance SC is connected to the TFT and another terminal of the storage capacitance SC is connected to the common line VC.

Figure 2:
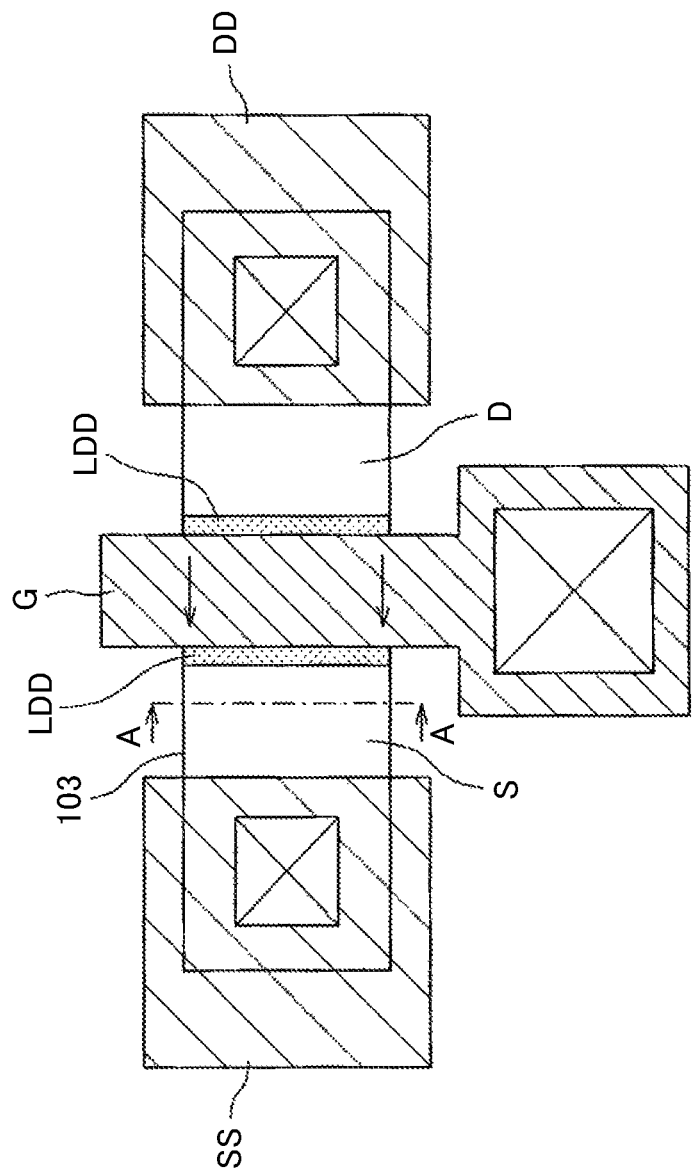
FIG. 2 is a plan view of the TFT that the present invention is not adopted.

FIG. 2 is a plan view of the TFT when the present invention is not adopted. In FIG. 2, the semiconductor layer 103 of LIPS (Low Temperature Poly Silicon) is formed, and the gate insulating film is formed on it. The gate electrode G is formed on the gate insulating film. The ion implantation is applied using the gate electrode G as a mask to dope e.g. phosphors (P) to form the n+ area for the drain area D and the source area S in the semiconductor layer 103. The drain electrode DD, which is formed by metal or alloy, is connected to the drain area and the source electrode, which is formed by metal or alloy, is connected to the source area.

Since ions don't penetrate into the portion under the gate electrode G, this portion of the semiconductor layer 103 becomes the channel. When the TFT works, a high field is formed between the channel and the drain area D or between the channel and the source area S, thus, a break down by hot carriers (electrons) tends to occur. To avoid this phenomenon, the LDD (Light Doped Drain) is formed between the channel and the drain area D and between the channel and the source area S. The LDD is an area of n−, which e.g. phosphors (P) are doped less than in the area of drain area D or source area S.

Figure 3:
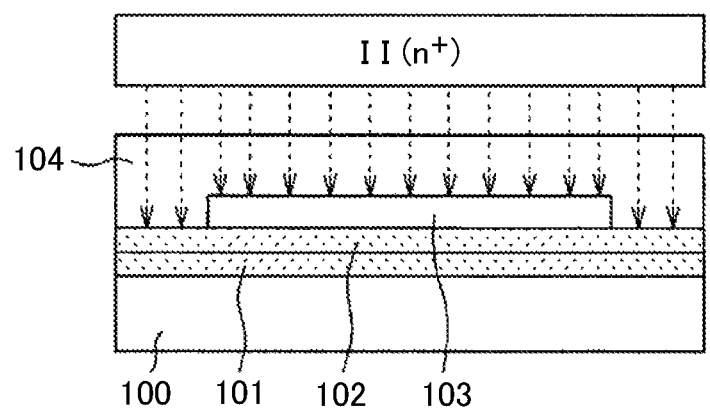
FIG. 3 is a cross sectional view that shows high density doping n+ area is being formed by ion implantation.
Figure 4:
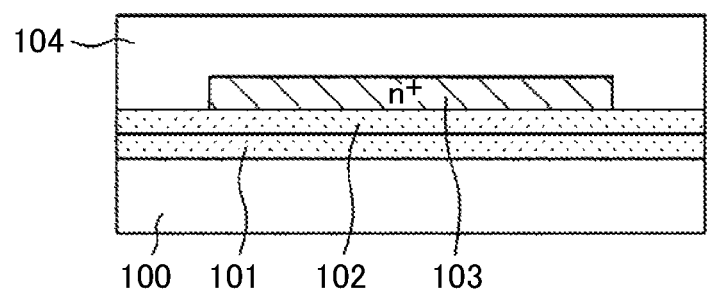
FIG. 4 is a cross sectional view that the ion implantation has been applied.

FIG. 3 is cross sectional view that shows highly doped area n+ is being formed by ion implantation. In FIG. 3, the first undercoat 101 and the second undercoat 102 are formed on the glass substrate 100; the semiconductor layer 103 is formed on the second undercoat 102. In FIG. 3, the semiconductor layer 103 is covered by the gate insulating film 104, however, there is no mask against the ion implantation; thus, this area becomes highly doped area n+. FIG. 4 is a cross sectional view that the ion implantation is completed, which the drain area D and the source area S are formed by highly doped area of n+.

Figure 5:
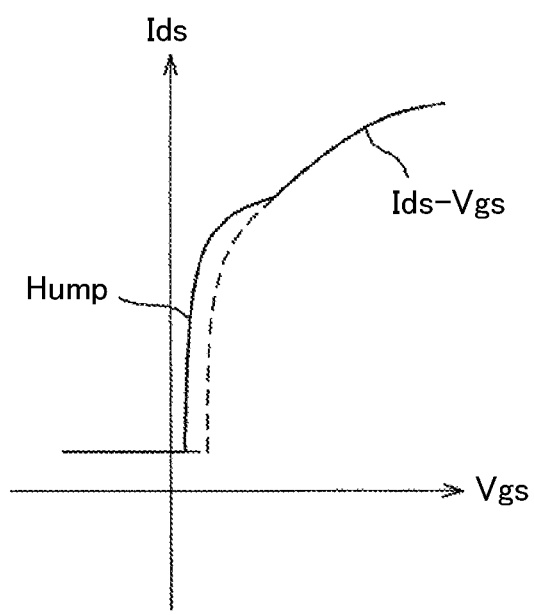
FIG. 5 is a graph shows the problem of the TFT that the present invention is not adopted.

FIG. 5 shows the problem of the TFT that was formed by the above described process. In FIG. 5, the abscissa is voltage Vgs that is a voltage between the gate electrode and the source electrode, while the ordinate is drain current Ids. In FIG. 5, the dotted curve is a designed characteristic of the TFT. The relation between brightness and video signal is designed according to the dotted line in FIG. 5. The TFT, which is shown by e.g. FIG. 2, however, has a portion as shown by the solid curve where the current abnormally increases at the low voltage area (herein after this area is called Hump). The reason of the Hump in FIG. 5 is that abnormal field is generated at the edge of the LDD of FIG. 2, thus, a current as shown by arrows in FIG. 2 is formed at the edge of the channel.

The Hump makes the characteristics of voltage-current relation deviate from the originally designed characteristics of the TFT. The purpose of the present invention is to eliminate the Hump, and thus, realizes a display device that has superior reproductions of images. The invention is explained by the embodiments below in detail.

First Embodiment

Figure 6:
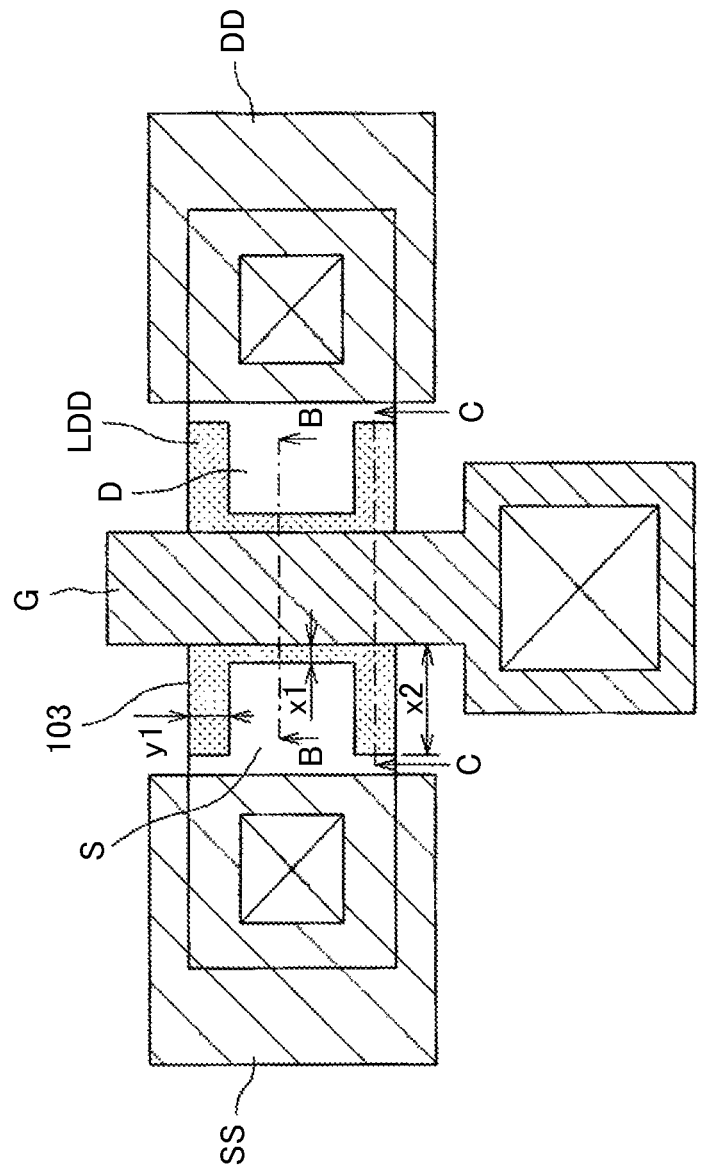
FIG. 6 is a plan view of the TFT according to the present invention.

FIG. 6 is a plan view of the TFT according to the present invention. The structure of the semiconductor layer 103, the gate electrode G, the source area S, the drain area D, the source electrode SS and the drain electrode DD is the same as explained in FIG. 2. The channel is formed under the gate electrode G; the channel has a channel length and a channel width. FIG. 6 differs from FIG. 2 in the structure of the LDD. In FIG. 6, the width x2 of the LDD in the channel length direction at the edge of the semiconductor layer 103 is bigger than the width x1 of the LDD in the channel length direction at the center of the semiconductor layer 103. The structure of FIG. 6 can suppress the influence of an abnormal field at the edge of the semiconductor layer 103 to the channel of the semiconductor layer 103, thus, the abnormal current can be suppressed.

In FIG. 6, the width x1 of the LDD at the center of the semiconductor layer 103 is e.g. 0.5 μm to 1.5 μm. The width x2 of the LDD at a vicinity to the edge of the semiconductor layer 103 is two times or more, preferably, three times or more of the width x1. The width x2 in FIG. 6 can extend up to the source electrode SS or the drain electrode DD. The reason is that most current from the source electrode SS or from the drain electrode DD flow in the source area S or in the drain area D; thus, the width x2 of the LDD actually doesn't influence to ON current of the TFT.

Provided the width of the semiconductor layer in the channel width direction is w, the width y1 of LDD in the direction of the channel width at the edge of the semiconductor layer 103 is preferably w/4 or less. If y1 is too big, ON current of the TFT is restricted. On the other hand, y1 is preferably bigger than x1.

In FIG. 6, assuming that the center portion of the LDD in the channel width direction is a first LDD area and the edge portion of the LDD in the channel width direction is a second LDD area, x1 is defined by a value at the center in the direction of the channel width direction of the first LDD area, x2 is defined by a value at the center in the direction of the channel width direction of the second LDD area. The value y1 is defined by a value at the center of the second LDD area in the channel length direction.

Figure 7:
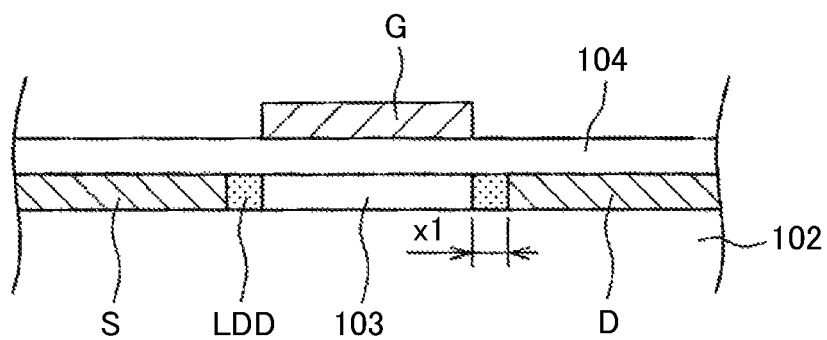
FIG. 7 is cross sectional view along the line B-B of FIG. 6.
Figure 8:
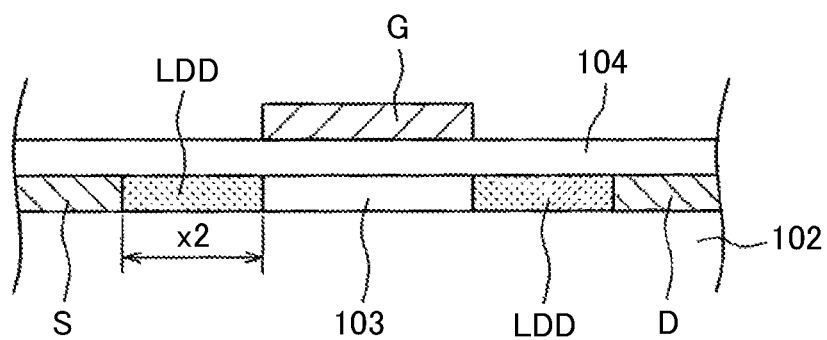
FIG. 8 is cross sectional view along the line C-C of FIG. 6.

FIG. 7 is cross sectional view along the line B-B of FIG. 6. In FIG. 7, the semiconductor layer 103 is formed on the undercoat 102; the gate insulating film 104 and the gate electrode G are formed in this order on the semiconductor layer 103. The channel is formed under the gate electrode G, the LDD is formed at the both sides of the channel, and the source area S and the drain area D are formed at the outside of the LDD. The width of the LDD in FIG. 7 is x1. FIG. 8 is cross sectional view along the line C-C of FIG. 6. The structure of FIG. 8 is the same as explained in FIG. 7 except width x2 of the LDD. The width x2 of the LDD in FIG. 8 is bigger than the width x2 of the LDD in FIG. 7.

Figure 9:
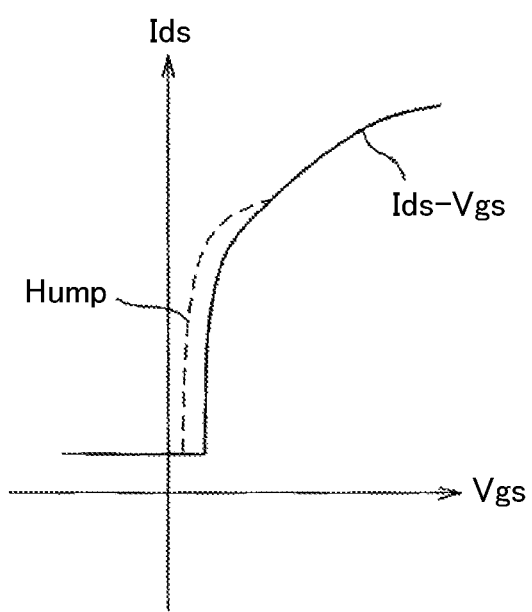
FIG. 9 is a graph that shows characteristics of the TFT according to the present invention.

FIG. 9 is a characteristic of the TFT according to the present invention. In FIG. 9, the abscissa is voltage Vgs that is a voltage between the gate electrode and the source electrode, while the ordinate is drain current Ids. In FIG. 9, the solid line is a characteristic of Vgs-Ids of the TFT according to the present invention. In the present invention, the Hump that is shown by dotted line in FIG. 9, is eliminated; thus, the TFT reveals an original characteristic. Therefore, a display device that uses this TFT has a good reproduction of images.

Figure 10:
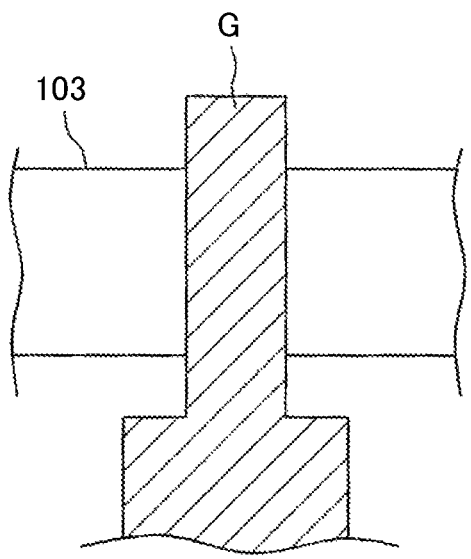
FIG. 10 is a plan view that the gate electrode G is formed on the semiconductor layer sandwiching the gate insulating film.
Figure 11:
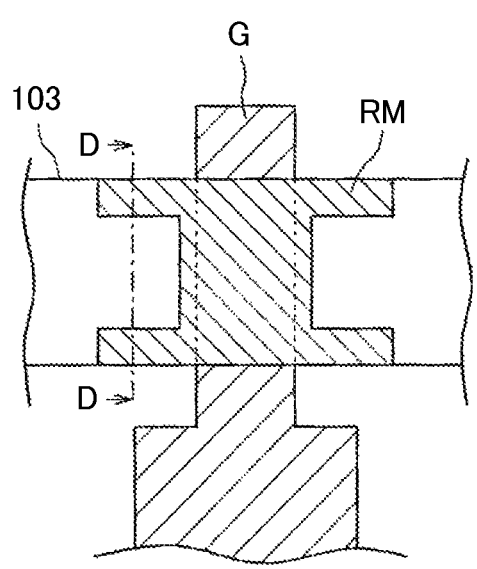
FIG. 11 is a plan view that the resist mask RM is formed on the gate electrode G and the semiconductor layer to form the LDD.

FIGS. 10-15 are interim structures in the process to realize the structure of the TFT in FIG. 6. FIG. 10 is a plan view that the gate electrode G is formed on the semiconductor layer 103 sandwiching the gate insulating film. FIG. 11 is a plan view that the resist mask RM is formed on the gate electrode G and the semiconductor layer 103 to form the LDD. By the way, in FIG. 11, for easy perception, each of the upper edge and the lower edge of the resist mask RM coincides with each of the upper edge and the lower edge of the semiconductor layer 103; however, the resist mask RM can be formed beyond the upper edge or the lower edge of the semiconductor layer.

Figure 12:
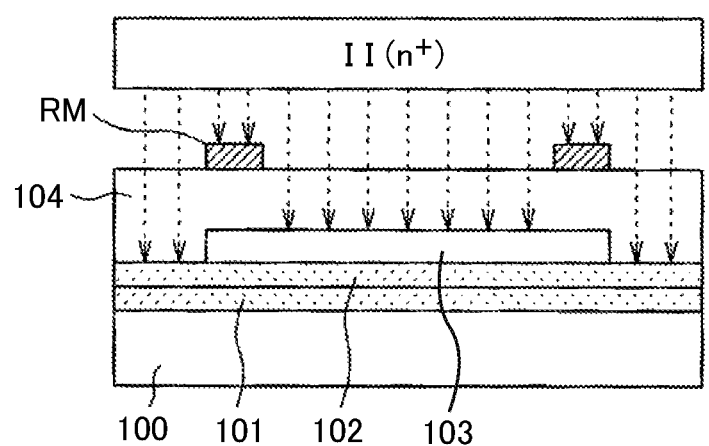
FIG. 12 is cross sectional view along the line D-D of FIG. 11 where ion implantation is applied to form the n+ area.

FIG. 12 is cross sectional view along D-D line of FIG. 11, which shows that the n+ area is being formed in the source area S in the semiconductor layer 103 by ion implantation. In FIG. 12, the first undercoat 101 and the second under coat 102 are formed on the glass substrate 100; the semiconductor layer 103 is formed on the second undercoat 102. The gate insulating film 104 is formed on the semiconductor layer 103, and the resist mask RM is formed on the gate insulating film 104.

In this state, for example, phosphors (P) are doped in the semiconductor layer 103 by ion implantation II to form the source area S or the drain area D. In the ion implantation II, energy of ions is controlled as that the ions can go through the gate insulating film 104, however, the ions cannot go through the resist mask RM; consequently, the area covered by the resist mask RM is not doped by ions.

Figure 13:
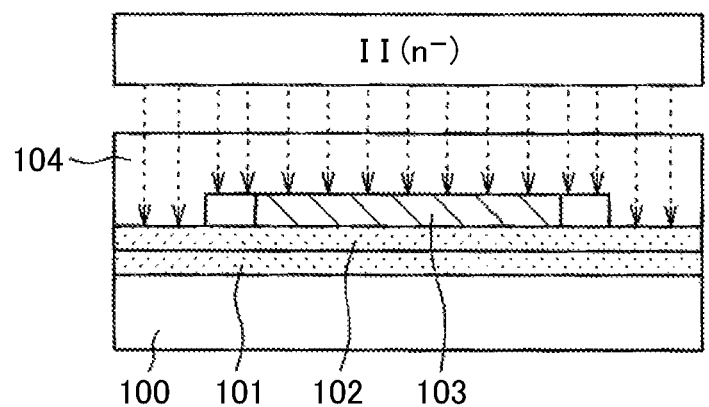
FIG. 13 is cross sectional view along the line D-D of FIG. 11 where ion implantation is applied to form the n− area.
Figure 14:
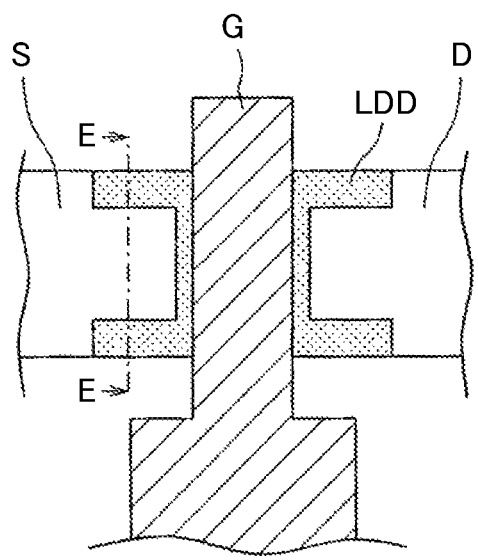
FIG. 14 is a plan view of the completed structure of the TFT according to the present invention.
Figure 15:
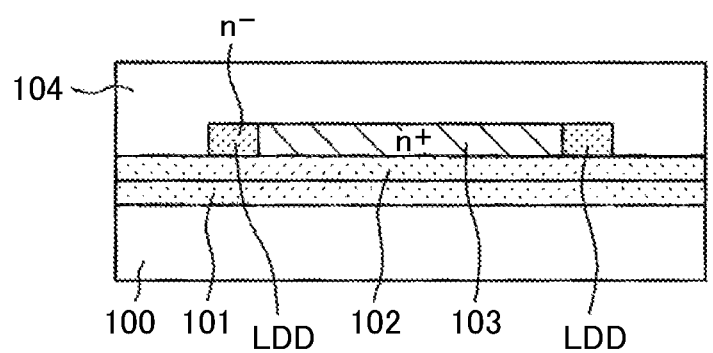
FIG. 15 is cross sectional view along the line D-D of FIG. 14.

After that, the resist mask is removed, then, as shown in FIG. 13, the ion implantation II of low density is applied to form the n– area at the area where the resist mask is removed, thus, the LDD is formed. FIG. 14 is a plan view of the LDD area formed as explained above. FIG. 15 is cross sectional view along E-E line of FIG. 14. In FIG. 15, the n– area is formed at the both sides of the n+ area.

Figure 16:
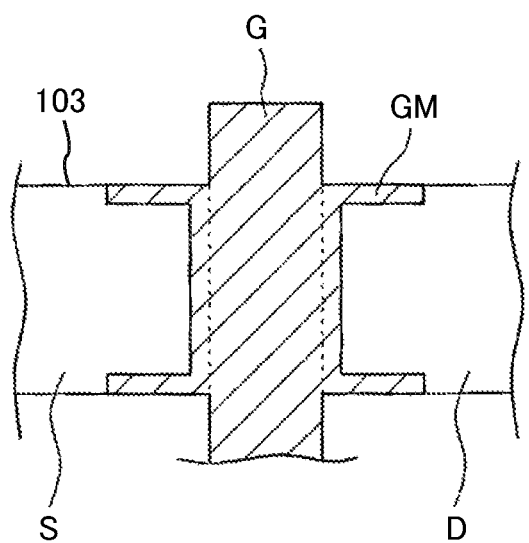
FIG. 16 is a plan view that shows another process to form the structure of the TFT according to the present invention.

The process shown in FIGS. 10-15 is only an example; other processes are applicable. For example, as shown in FIG. 16, the gate mask GM is formed to cover the LDD area; the high density ion implantation is applied to form the source area S and the drain area D. After that the gate mask GM is etched to form the gate electrode G as depicted by the dotted line of FIG. 16; at this stage, low density ion implantation II is applied to form the LDD of n–.

The LDD area, which was made by the above process, can be checked as that: (1) Checking the color of the semiconductor layer: the amount of ion doping in the LDD is different from other part of the semiconductor layer. The color of the semiconductor becomes different according to the amount of doped ions. Thus, the change of color can be observed to check whether the present invention is applied or not. (2) Checking the etching rate: the etching rate of the LDD becomes different because the damage to the LDD is different according to the amount of the doped ion; thus, observing the difference of etching rate by etching the semiconductor layer with e.g. hydrofluoric acid to check whether the present invention is applied or not. In other words, if the etching rates are different, a step at the border of the n+ area and the n– area is formed. (3) Checking the amount of ions: the difference of the amount of ions can be directly checked by e.g. a mass spectroscopy as SIMS (Secondary Ion Mass Spectrometry) or by e.g. an element analysis as EDX (Energy Dispersive X-ray Spectrometry).

(4) Checking the amount of unpaired electrons: the amount of unpaired electrons in the LDD becomes different because the damage by the ion doping in the LDD is different from other portions of the semiconductor layer. Thus, difference can be checked by observing the resonance signal strength of electron spins by ESR (Electron pin resonance).

Figure 17:
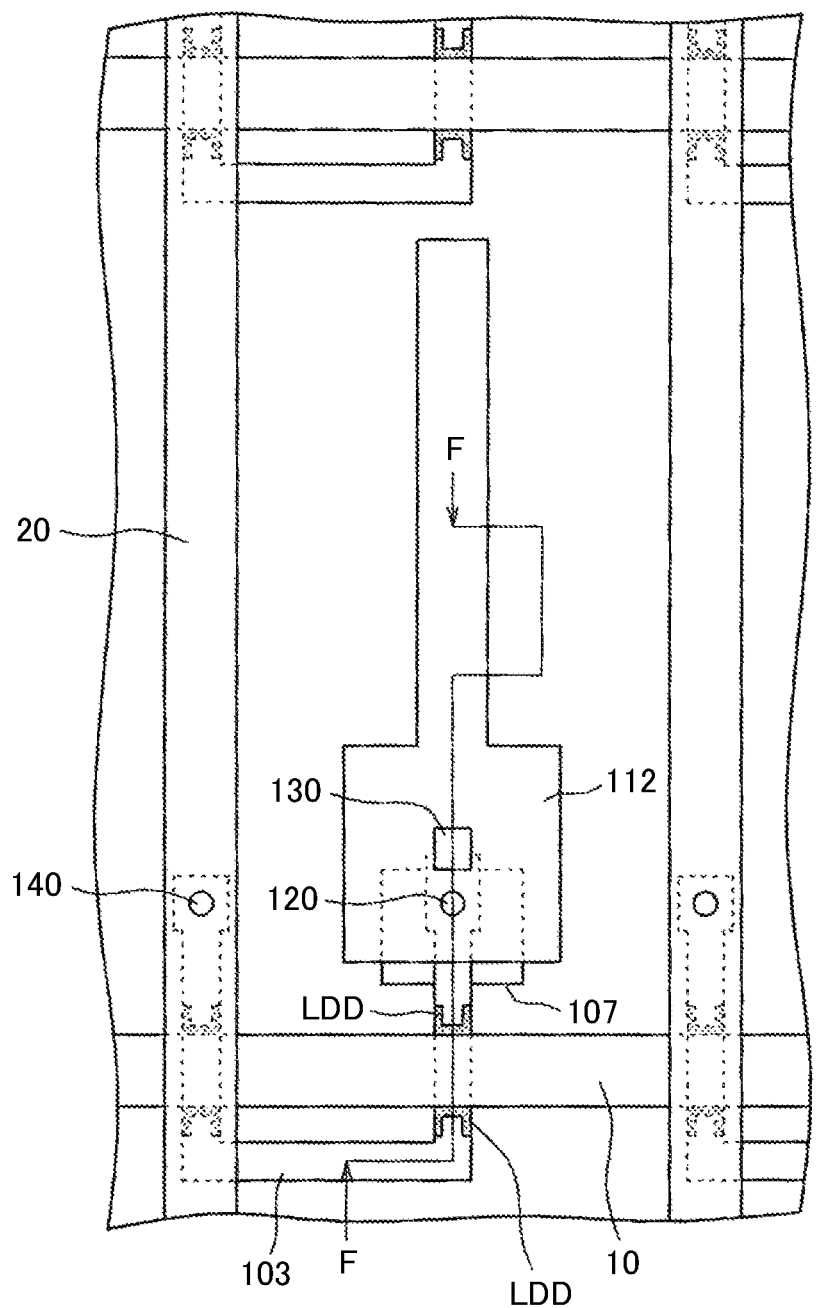
FIG. 17 is a plan view of the pixel of the liquid crystal display device where the TFT of the present invention is applied.

FIG. 17 is a plan view of the pixel including the TFT according to the present invention formed by the above process in the liquid crystal display device. In FIG. 17, the scanning lines 10 extend in lateral direction and arranged in longitudinal direction. The video signal lines 20 extend in longitudinal direction and arranged in lateral direction. The pixel electrode 112 is formed in the area surrounded by the scanning lines 10 and the video signal lines 20. The pixel electrode 112 in FIG. 17 is one stripe shaped, however, when the pixel becomes larger, the pixel electrode can be an electrode having plural combs.

In FIG. 17, the semiconductor layer of the LTPS, which constitutes the TFT, is formed. The semiconductor layer 103 is formed on the lower layer than the scanning line 10. The semiconductor layer 103 connects with the video signal line 20 through the through hole 140, and extends along and under the video signal line 20 in longitudinal direction. The semiconductor layer bends twice to connect with the pixel electrode 112. The TFT is formed when the semiconductor layer 103 crosses under the scanning line 10, namely, the scanning line 10 works as a gate electrode. In FIG. 17, two TFTs are formed, which is called a double gate structure. In FIG. 17, the LDDs of the present invention are formed sandwiching the scanning line 10 in a plan view; thus, Hump in the TFT characteristics is suppressed and ON-OFF characteristics of the TFT can be precisely controlled.

Figure 18:
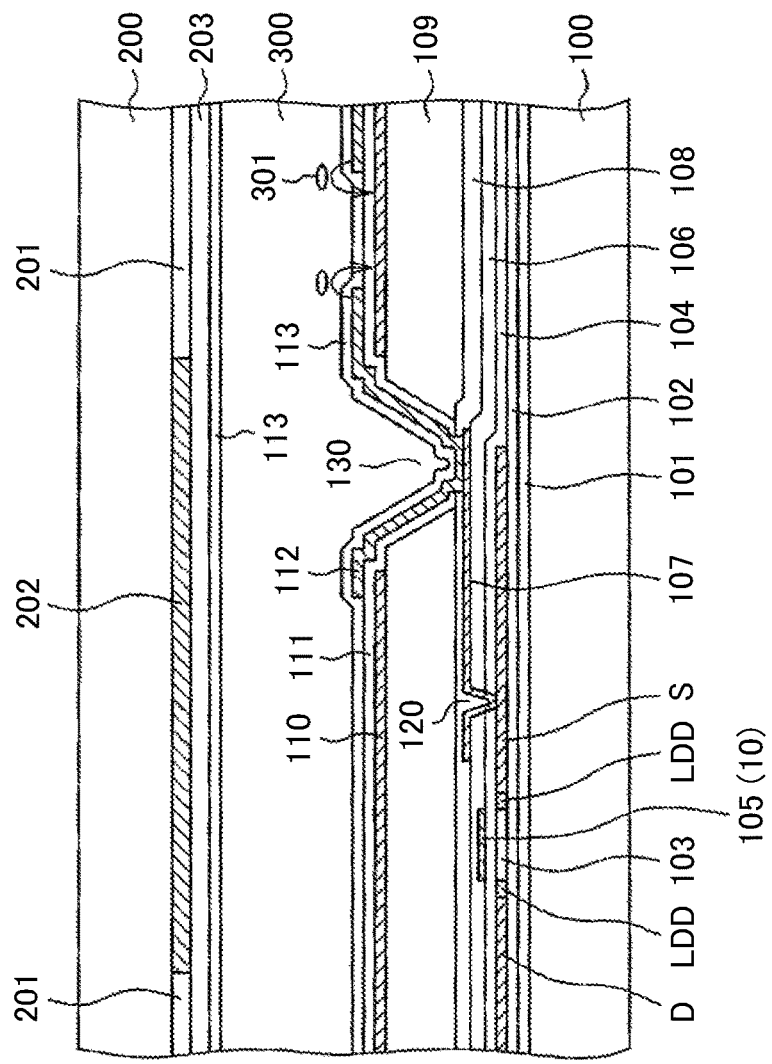
FIG. 18 is a cross sectional view along the line D-D of FIG. 17.

In FIG. 17, the semiconductor layer 103 connects with the contact electrode 107 through the through hole 120; the contact electrode 107 connects with the pixel electrode 112 through the through hole 130. When the TFT is ON, the data signal is imported in the pixel electrode 112, and the video signal is held in the storage capacitance SC FIG. 18 is cross sectional view along F-F line in FIG. 17. In FIG. 18, only one TFT is described. In FIG. 18, the first undercoat formed by silicon oxide SiO and the second undercoat 102 formed by silicon nitride SiN are formed by CVD (Chemical Vapor Deposition) on the glass substrate 100. The first undercoat 101 and the second undercoat 102 prevent the semiconductor layer 103 from being contaminated by impurities from the glass substrate 100.

The semiconductor layer 103 is formed on the second undercoat 102. The semiconductor 103 is made as that: amorphous silicon film a-Si is formed on the second undercoat 102 by CVD; the amorphous silicon film a-Si is transformed to poly-silicon film by applying excimer laser; the poly-silicon layer is patterned by lithography.

The gate insulating film 104 is formed on the semiconductor layer 103. The gate insulating film 104 is formed by SiO using TEOS (Tetraethyl orthosilicate) as material. The gate insulating film 104 is also formed by CVD. The gate electrode 105 is formed on the gate insulating film 104. The scanning line 10 in FIG. 2 works as the gate electrode 105. The gate electrode 105 is formed by e.g. MoW film. If the resistance of the scanning line 10 or gate electrode 105 must be low, Al alloy is used.

The gate electrode is patterned by photolithography. After formation of the gate electrode 105, the resist mask for ion implantation to form LDD is formed. After that the source S or the drain D of n+ areas are formed by doping high density of impurity as e.g. phosphors (P) by ion implantation. After that, the resist make is removed and the n– area of LDD is formed by doping low density of impurity as e.g. phosphors (P) by ion implantation. This process is already explained in FIGS. 10-15.

After that, the first interlayer insulating film 106 is formed by SiO covering the gate electrode 105. The first interlayer insulating film 106 is to insulate between the gate electrode 105 (or scanning line 10) and the contact electrode 107. The through hole 120 is formed in the interlayer insulating film 105 and the gate insulating film 104 to connect the source S of the semiconductor layer 103 and the contact electrode 107. The photolithography for the through hole 120 in the interlayer insulating film 106 and in the gate insulating film 104 is commonly applied to the two layers.

The contact electrode 107 is formed on the interlayer insulating film 106. The contact electrode 107 connects with the pixel electrode 112 through the through hole 130. The drain D of the TFT connects with the video signal line 20 through the through hole 140 in FIG. 17.

The contact electrode 107 and the video signal line 20 are formed on the same layer and formed simultaneously. The contact electrode 107 and the video signal line 20 (herein after they are represented by the contact electrode) formed by e.g. AlSi alloy to decrease the electric resistance. The AlSi alloy has problems as generating hillocks or defusing of Al in other layers, thus, the AlSi is sandwiched by a barrier layer and a cap layer, both are formed by e.g. MoW.

The inorganic passivation film (insulating film) 108 is formed covering the contact electrode 107 to protect the entire TFT. The inorganic passivation film is formed by CVD, the same process as the first undercoat 101. The organic passivation film 109 is formed covering the inorganic passivation film 108. The organic Passivation film 109 is formed by photo sensitive acrylic. The organic passivation film 109 can be formed not only by acrylic but also by silicone resin, epoxy resin, polyimide resin, etc. The organic passivation film 109 is made thick since it has a role of a flattening film. Thickness of the organic passivation film 109 is 1-4 μm, and often it is approximately 2 μm.

The through hole 130 is formed in the organic passivation film 109 to connect the pixel electrode 110 and the contact electrode 107. Photo sensitive material is used for the organic passivation film 109. The photo sensitive material is coated on the inorganic passivation film 108, then the photo sensitive material is exposed using a mask; the exposed area of the photo sensitive material dissolves in certain developer. Therefore, forming of photo resist is eliminated by using the photo sensitive material. After the through hole 130 is formed in the organic passivation film 109, the organic passivation film 109 is baked at approximately 230 centigrade, thus, the organic passivation film 109 is completed.

After that, ITO (Indium Tin Oxide) is formed by sputtering on the organic passivation film 109 to form the common electrode 110; the ITO is eliminated from the through hole 130 and its surroundings. The common electrode 110 can be formed in common in plural pixels. After that, SiN is formed on entire area to form the second interlayer insulating film 111. Subsequently, the through hole is formed in the second interlayer insulating film 111 and the inorganic passivation film 108 at the inside of the through hole 130.

After that, ITO is formed by sputtering and is patterned to form the pixel electrode 112. An example of the plan view of the pixel electrode 112 is described in FIG. 17. Material of the alignment layer is formed on the pixel electrode 112 by flexographic printing or by inkjet; subsequently, the material is baked to form the alignment film. A rubbing method or a photo alignment method using UV light is used for the alignment process.

When a voltage is applied between the pixel electrode 112 and the common electrode 110, a line of force shown in FIG. 18 is generated. The line of force rotates the liquid crystal molecules 301 to control the transmittance of light in individual pixels, thus, images are formed.

In FIG. 18, the counter substrate is set opposing to the TFT substrate 100 sandwiching the liquid crystal layer 300. Color filters 201 are formed inside of the counter substrate 200. Either one of red color filter, green color filter or blue color filer is formed in each of the pixels, thus, color images are produced. The black matrix 201 is formed between the color filters to raise the contrast of the images. The black matrix also has a role of a light shielding film for the TFT, thus, a photo current in TFT is suppressed.

The overcoat film 203 is formed to cover the color filters 201 and the black matrix 202. Since the surface of the layer of the color filters 201 and the black matrix 202 is rough, the overcoat film has a role to make the surface smooth. The alignment layer 113 is formed on the overcoat film 203 to determine the initial alignment of the liquid crystal molecules 301. A rubbing method or a photo alignment method is used for the alignment process of the alignment film 113, which is the same as explained at the alignment film on the TFT substrate 100.

The above explained structure is an example. In some products, the inorganic passivation film 108 on the TFT substrate may not exist. Manufacturing process of the through hole 130 may be different according to the products.

Figure 19:
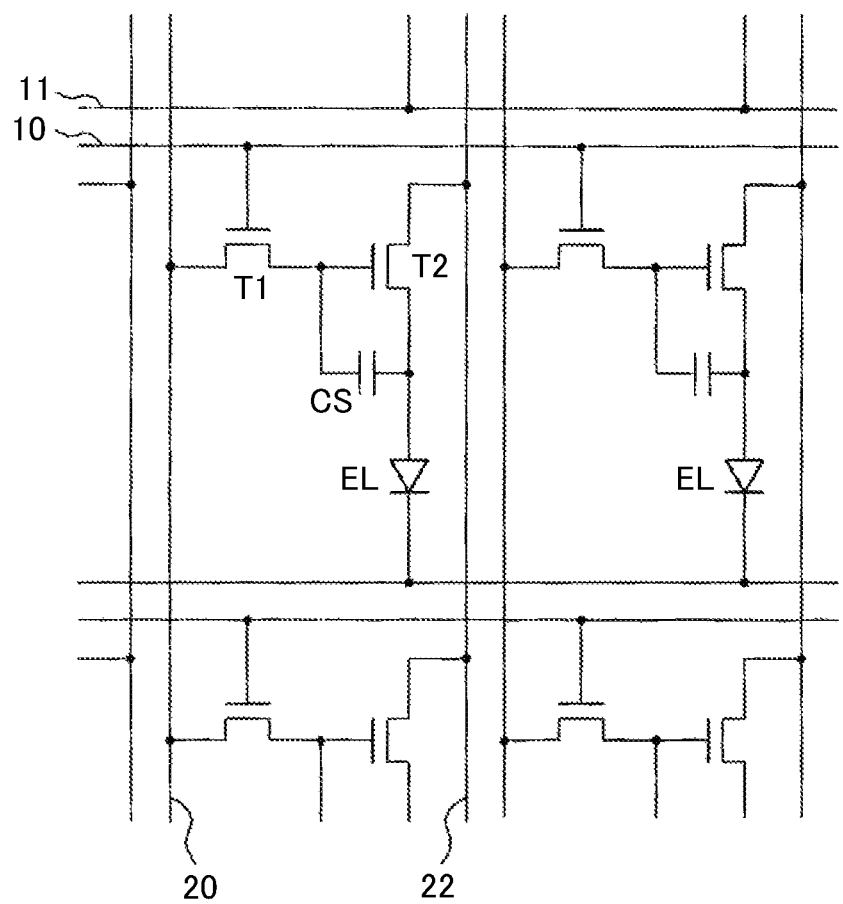
FIG. 19 is an equivalent circuit of the pixels of the organic EL display device.

FIG. 19 is an equivalent circuit that shows the structure of the pixel area of the organic EL display device as an example of other display devices. In FIG. 19, the pixel is formed in the area that is surrounded by the scanning lines, the earth lines 11, the video signal lines 20 and power lines 21. In the pixel, the organic (EL) element EL constituted by the organic EL layer and the driving TFT (T2), which drives the organic EL element (EL), are connected in series. The storage capacitance CS is formed between the gate and the drain of the driving TFT (T2). The current is supplied to the organic EL element (EL) from the driving TFT (T2) according to the voltage of the storage capacitance SC.

In FIG. 19, the gate of the selecting TFT (T1) is connected to the scanning line 10; open or close of the selecting TFT (T1) is determined by ON or OFF signal in the scanning line 10. When the selecting TFT (T1) is ON, the video signals are retrieved in the pixel electrode and charges are stored in the storage capacitance CS. The driving TFT (T2) is driven by the potential of the storage capacitance and current is supplied to the organic EL element (EL).

In the structure of FIG. 19, the first TFT, which is a switching TFT, and the second TFT, which drives the organic EL element, are formed. By the way, the first TFT can be a double gate TFT. As described above, in the organic EL display device, too, TFTs are used. In those TFTs, if the Hump occurs, images on the screen are deteriorated. Thus, high quality display can be realized by adopting TFTs according to the present invention.

The driving circuit can be formed by TFTs and can be built in the display substrate in both of the liquid crystal display device and the organic EL display device. A display device having stable driving characteristics can be realized by adopting TFTs of the present invention in the driving circuit.

In the above examples, the semiconductor layers are formed by LTPS, however, normal Poly-Si can also be applicable to the semiconductor layer in the present invention.

What is claimed is:

1. A thin film transistor having a semiconductor layer, a gate insulating film and a gate electrode comprising:
   a channel, a drain and a source are formed in the semiconductor layer,
   the channel has a channel length and a channel width,
   a LDD (Light Doped Drain) is formed between the channel and the drain or between the channel and the source,
   the LDD including a first LDD area, which is formed at a center of the LDD in the direction of the channel width, and a second LDD area, which is formed at an edge of the LDD in the direction of the channel width,
   wherein a width of the second LDD area in the channel length direction is bigger than a width of the first LDD area in the channel length direction.

2. The thin film transistor according to claim 1, wherein the width of the second LDD area in the channel length direction is two times or more of the width of the first LDD area in the channel length direction.

3. The thin film transistor according to claim 1, wherein the width of the second LDD area in the channel length direction is three times or more of the width of the first LDD area in the channel length direction.

4. The thin film transistor according to claim 1, wherein the width of the second LDD area in the channel width direction is bigger than the width of the first LDD area in the channel length direction.

5. The thin film transistor according to claim 1, wherein the width of the second LDD area in the channel width direction is ¼ or less compared to the width of the semiconductor layer in the channel length direction.

6. The thin film transistor according to claim 1, wherein the thin film transistor is used in a pixel of a liquid crystal display device.

7. The thin film transistor according to claim 1, wherein the thin film transistor is used in a driving circuit in a liquid crystal display device.

8. The thin film transistor according to claim 1, wherein the thin film transistor is used in a pixel of an organic EL display device.

9. The thin film transistor according to claim 1, wherein the thin film transistor is used in a driving circuit in an organic EL display device.

10. A liquid crystal display device comprising pixels and a driving circuit,
    wherein each of the pixels includes the thin film transistor defined by claim 1.

11. A liquid crystal display device comprising pixels and a driving circuit,
    wherein each of the pixels and the driving circuit includes the thin film transistor defined by claim 1.

12. An organic EL display device comprising pixels and a driving circuit,
    wherein each of the pixels includes the thin film transistor defined by claim 1.

13. An organic EL display device comprising pixels and a driving circuit,
    wherein each of the pixels and the driving circuit includes the thin film transistor defined by claim 1.

* * * * *